(12) United States Patent
Doris et al.

(10) Patent No.: US 8,617,956 B2
(45) Date of Patent: Dec. 31, 2013

(54) METHOD AND STRUCTURE FOR FORMING HIGH-K/METAL GATE EXTREMELY THIN SEMICONDUCTOR ON INSULATOR DEVICE

(75) Inventors: Bruce B. Doris, Brewster, NY (US); Kangguo Cheng, Guilderland, NY (US); Ali Khakifirooz, Slingerlands, NY (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 653 days.

(21) Appl. No.: 12/859,414

(22) Filed: Aug. 19, 2010

(65) Prior Publication Data
US 2012/0043623 A1 Feb. 23, 2012

(51) Int. Cl.
*H01L 29/78* (2006.01)
*H01L 21/36* (2006.01)

(52) U.S. Cl.
USPC ............... 438/300; 257/400; 257/E21.409; 257/E29.255

(58) Field of Classification Search
None
See application file for complete search history.

(56) References Cited

U.S. PATENT DOCUMENTS

| | | | |
|---|---|---|---|
| 6,403,434 B1 | 6/2002 | Yu | |
| 6,495,437 B1 | 12/2002 | Yu | |
| 6,580,137 B2 * | 6/2003 | Parke | 257/401 |
| 6,586,808 B1 * | 7/2003 | Xiang et al. | 257/407 |
| 6,756,277 B1 | 6/2004 | Yu | |
| 6,858,524 B2 | 2/2005 | Haukka et al. | |
| 7,045,406 B2 | 5/2006 | Huotari et al. | |
| 7,091,069 B2 | 8/2006 | Doris et al. | |
| 7,122,414 B2 | 10/2006 | Huotari | |
| 7,312,125 B1 | 12/2007 | Xiang et al. | |
| 7,439,596 B2 | 10/2008 | Yoo et al. | |
| 2002/0192911 A1 * | 12/2002 | Parke | 438/270 |
| 2005/0090066 A1 * | 4/2005 | Zhu et al. | 438/300 |
| 2006/0001095 A1 | 1/2006 | Doris et al. | |
| 2006/0237791 A1 | 10/2006 | Doris et al. | |
| 2012/0038008 A1 * | 2/2012 | Guo et al. | 257/408 |

* cited by examiner

*Primary Examiner* — Hrayr A Sayadian
(74) *Attorney, Agent, or Firm* — Scully, Scott, Murphy & Presser, P.C.; H. Daniel Schnurmann (57) ABSTRACT

A semiconductor device is provided that includes a gate structure present on a substrate. The gate structure includes a gate conductor with an undercut region in sidewalls of a first portion of the gate conductor, wherein a second portion of the gate conductor is present over the first portion of the gate conductor and includes a protruding portion over the undercut region. A spacer is adjacent to sidewalls of the gate structure, wherein the spacer includes an extending portion filling the undercut region. A raised source region and a raised drain region is present adjacent to the spacers. The raised source region and the raised drain region are separated from the gate conductor by the extending portion of the spacers.

13 Claims, 4 Drawing Sheets

METHOD AND STRUCTURE FOR FORMING HIGH-K/METAL GATE EXTREMELY THIN SEMICONDUCTOR ON INSULATOR DEVICE

BACKGROUND

The present disclosure relates generally to semiconductor devices. More particularly, the present disclosure relates to scaling of semiconductor devices.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties. Additionally, all dimensions of the device must be scaled simultaneously in order to optimize the electrical performance of the device. As the conductive elements of the structure are positioned closer and closer together, and the amount of dielectric material separating the conductive elements is decreased, the parasitic capacitance of the structure increases.

SUMMARY

A method of forming a semiconductor device is provided in which the raised source region and the raised drain region of the semiconductor device are separated from the gate conductor of the gate structure by a spacer having an extension portion that is positioned within an undercut region formed in the sidewall of the gate structure. In one embodiment, the method begins with forming a dummy gate on a substrate. The dummy gate may have an undercut region present in sidewalls of the dummy gate. A spacer is formed adjacent to the sidewalls of the dummy gate. A first spacer portion of the spacer includes an extension portion with a first width that fills the undercut region in the sidewall of the dummy gate. A second spacer portion is present atop the first spacer portion. The second spacer portion has a second width that is less than the first width of the first spacer portion. A raised source region and a raised drain region are formed on the substrate adjacent to the spacer, wherein the raised source region and the raised drain region are separated from the dummy gate by the extension portion of the spacer. The dummy gate is removed to provide an opening to the substrate. The opening is filled with a gate structure including a gate conductor having an undercut region filled with the extension portion of the spacer.

In another aspect, a semiconductor device is provided. The semiconductor device may include a gate structure present on a substrate. The gate structure may include a gate conductor having a first portion on the substrate, and a second portion on the first portion of the gate conductor. The first portion of the gate conductor includes an undercut region in the sidewalls of the gate conductor. The second portion of the gate conductor includes protruding portions over the undercut region of the first portion of the gate conductor. A spacer is present adjacent to the sidewalls of the gate structure. The spacer includes an extension portion filling the undercut region of the first portion of the gate conductor. A raised source region and a raised drain region are present adjacent to the spacer, wherein the raised source region and the raised drain region are separated from the gate conductor by the extension portion of the spacer.

DESCRIPTION OF THE DRAWINGS

The following detailed description, given by way of example and not intended to limit the present disclosure solely thereto, will best be appreciated in conjunction with the accompanying drawings, wherein like reference numerals denote like elements and parts, in which.

DETAILED DESCRIPTION

Detailed embodiments of the present disclosure are described herein; however, it is to be understood that the disclosed embodiments are merely illustrative of the present disclosure that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure relates to a method for forming a planar semiconductor device on a semiconductor on insulator (SOI) substrate having an extremely thin semiconductor on insulator (ETSOI) layer. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. In one embodiment, the semiconductor device that is provided by the present disclosure is a field effect transistor. A field effect transistor is a semiconductor device in which output current, i.e., source-drain current, is controlled by the voltage applied to a gate structure. A field effect transistor has three terminals, i.e., a gate structure, a source and a drain region. The gate structure is a structure used to control output current, i.e., flow of carriers in the channel, of a semiconducting device, such as a field effect transistor, through electrical or magnetic fields. The channel is the region between the source region and the drain region of a semiconductor device that becomes conductive when the semiconductor device is turned on. The source region, e.g., raised source region and corresponding extension, is a doped region in the semiconductor device, in which majority carriers are flowing into the channel. The drain region, e.g., raised drain region and corresponding extension, is the doped region in semiconductor device located at the end of the channel, in which carriers are flowing out of the semiconductor device through the drain region. The channel portion of the semiconductor layer is the location of the channel of the semiconductor device that is formed on the semiconductor layer. An extremely thin semiconductor on insulator (ETSOI) layer is a semiconductor layer that is present atop a buried insulating layer of an SOI substrate, wherein the ETSOI layer has a thickness of 10 nm or less.

In semiconductor devices that are formed on ETSOI substrates, raised source regions and raised drain regions are typically utilized to provide the appropriate dopant concentration. As used herein, the term "raised" in combination with source and/or drain region denotes that the source and/or drain region is formed on a semiconductor material layer that is present on an upper surface of the substrate on which the gate structure, e.g., gate dielectric, is present. However, it has been determined that raised source regions and raised drain regions adversely result in an increase in the parasitic capacitance between the gate structure and the raised source region and the raised drain region. In some embodiments and in order to reduce parasitic capacitance, the method disclosed herein provides a spacer that increases the amount of dielectric material that separates the raised source region and raised drain region from the conductive features of the gate structure. In one embodiment, a method is disclosed in which a spacer having an extension portion is employed to increase the amount of dielectric material between the gate conductor and the raised source region and the raised drain region. This particular embodiment is depicted in FIGS. 1-8.

Figure 1:
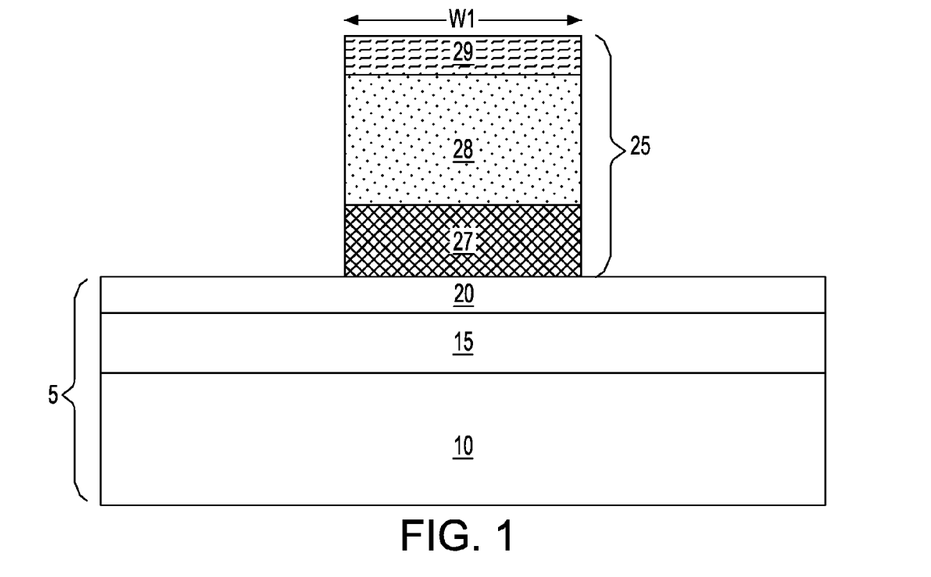
FIG. 1 is a side cross-sectional view depicting forming a dummy gate on a substrate, in accordance with one embodiment of the present disclosure.

FIG. 1 illustrates the results of the initial processing steps that produce a substrate 5, i.e., semiconductor on insulator (SOI) substrate, in which the substrate 5 comprises at least a first semiconductor layer 20 (hereafter referred to as an ETSOI layer 20) overlying a dielectric layer 15, wherein the ETSOI layer 20 has a thickness of less than 10 nm. A second semiconductor layer 10 may be present underlying the dielectric layer 15.

The ETSOI layer 20 may comprise any semiconducting material including, but not limited to, Si, strained Si, SiC, SiGe, SiGeC, Si alloys, Ge, Ge alloys, GaAs, InAs, and InP, or any combination thereof. The ETSOI layer 20 may be thinned to a desired thickness by planarization, grinding, wet etch, dry etch, oxidation followed by oxide etch, or any combination thereof. One method of thinning the ETSOI layer 20 is to oxidize silicon by a thermal dry or wet oxidation process, and then wet etch the oxide layer using a hydrofluoric (HF) acid mixture. This process can be repeated to achieve the desired thickness. In one embodiment, the ETSOI layer 20 has a thickness ranging from 1.0 nm to 10.0 nm. In another embodiment, the ETSOI layer 20 has a thickness ranging from 1.0 nm to 5.0 nm. In a further embodiment, the ETSOI layer 20 has a thickness ranging from 3.0 nm to 8.0 nm. The second semiconductor layer 10 may be a semiconducting material including, but not limited to, Si, strained Si, SiC, SiGe, SiGeC, Si alloys, Ge, Ge alloys, GaAs, InAs, InP as well as other III/V and II/VI compound semiconductors.

The dielectric layer 15 that can be present underlying the ETSOI layer 20 and atop the second semiconductor layer 10 may be formed by implanting a high-energy dopant into the substrate 5 and then annealing the structure to form a buried insulating layer, i.e., dielectric layer 15. In another embodiment, the dielectric layer 15 may be deposited or grown prior to the formation of the ETSOI layer 20. In yet another embodiment, the substrate 5 may be formed using wafer-bonding techniques, where a bonded wafer pair is formed utilizing glue, adhesive polymer, or direct bonding.

FIG. 1 also depicts forming a dummy gate 25 on the substrate 5. As used herein, a "dummy gate" is a structure that defines the geometry of the later formed gate structure that operates the semiconductor device, in which the dummy gate is removed and the gate structure that operates the semiconductor device is formed in its place. In one embodiment, forming the dummy gate 25 includes forming a material stack on the substrate 5. The material stack can include a first material layer 27 present on the substrate 5, and a second material layer 28 present on the first material layer 27. An optional dielectric cap 29 can also be present on the second material layer 28.

The first material layer 27 may be composed of any material that can be etched selectively to the underlying substrate 5 and the subsequently formed second material layer 28. In one embodiment, the first material layer 27 is composed of a dielectric, such as an oxide, nitride, oxynitride or a combination thereof. The first material layer 27 may be composed of a low-k dielectric material or a high-k dielectric material. Low-k dielectric materials have a dielectric constant measured at room temperature (25° C.) that is 4.0 or less, wherein high-k dielectric materials have a dielectric constant measured at room temperature (25° C.) that is greater than 4.0.

The first material layer 27 may be formed using a deposition process, such as chemical vapor deposition. Chemical vapor deposition (CVD) is a deposition process in which a deposited species is formed as a results of chemical reaction between gaseous reactants at an elevated temperature (typically being greater than 200° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The first material layer 27 typically has a thickness ranging from 1 nm to 50 nm. In another embodiment, the first material layer 27 has a thickness ranging from 2 nm to 30 nm. In yet another embodiment, the first material layer 27 has a thickness ranging from 5 nm to 20 nm. In one example, the first material layer 27 is composed of silicon oxide.

The second material layer 28 may be composed of any material that can be etched selectively to the underlying first material layer 27. In one embodiment, the second material layer 28 may be composed of a semiconductor-containing material, such as a silicon-containing material, e.g., polysilicon. Silicon-containing materials suitable for the second material layer 28 include single crystal silicon, amorphous silicon, polysilicon, silicon germanium and silicon doped with carbon (Si:C) and combinations thereof. Although, the second material layer 28 is typically composed of a semiconductor material, the second material layer 28 may also be composed of a dielectric material, such as an oxide, nitride or oxynitride material, or amorphous carbon. The second material layer 28 may be formed using a deposition process, such as chemical vapor deposition. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The second material layer 28 typically has a thickness ranging from 5 nm to 50 nm. In another embodiment, the second material layer 28 has a thickness ranging from 10 nm to 40 nm. In yet another embodiment, the second material layer 28 has a thickness ranging from 20 nm to 30 nm. In one example, the second material layer 28 is composed of polysilicon.

As mentioned above, the material stack may also include a dielectric cap 29 that is present on the second material layer 28. The dielectric cap 29 may be composed of an oxide, nitride or oxynitride material. The dielectric cap 29 may have a thickness ranging from 1 nm to 10 nm. In another embodiment, the dielectric cap 29 has a thickness ranging from 2 nm to 5 nm. In one example, the dielectric cap 29 is composed of silicon nitride. In some embodiments, the dielectric cap 29 may be omitted.

The material stack may be patterned and etch to provide the dummy gate 25. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied.

In one embodiment, the etch process first etches the dielectric cap 29 to provide a hard mask with an etch chemistry that removes the material of the dielectric cap 29 selective to the second material layer 28 and the photoresist mask (not shown). The photoresist mask may then be removed. The remaining portion of the dielectric cap 29 then functions as an etch mask to remove the exposed portions of the second material layer 28 and the first material layer 27 with etch chemistries that are selective to the substrate 5 and the dielectric cap 29. In one embodiment, the etch process that forms the dummy gate 25 is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Reactive ion etching (RIE) is a form of plasma etching in which during etching the surface to be etched is placed on the RF powered electrode is exposed to reactive gases in the presence of an RF field. Moreover, during RIE the surface to be etched takes on a potential that accelerates the reactive etching species extracted from a plasma toward the surface, in which the chemical etching reaction is taking place in the direction normal to the surface. Other examples of anisotropic etching that can be used at this point of the present disclosure include ion beam etching, plasma etching or laser ablation.

The width W1 of the dummy gate 25 may range from 5 nm to 500 nm. In another embodiment, the width W1 of the dummy gate 25 may range from 10 nm to 100 nm. In yet another embodiment, the width W1 of the dummy gate 25 may range from 15 nm to 50 nm.

Figure 2:
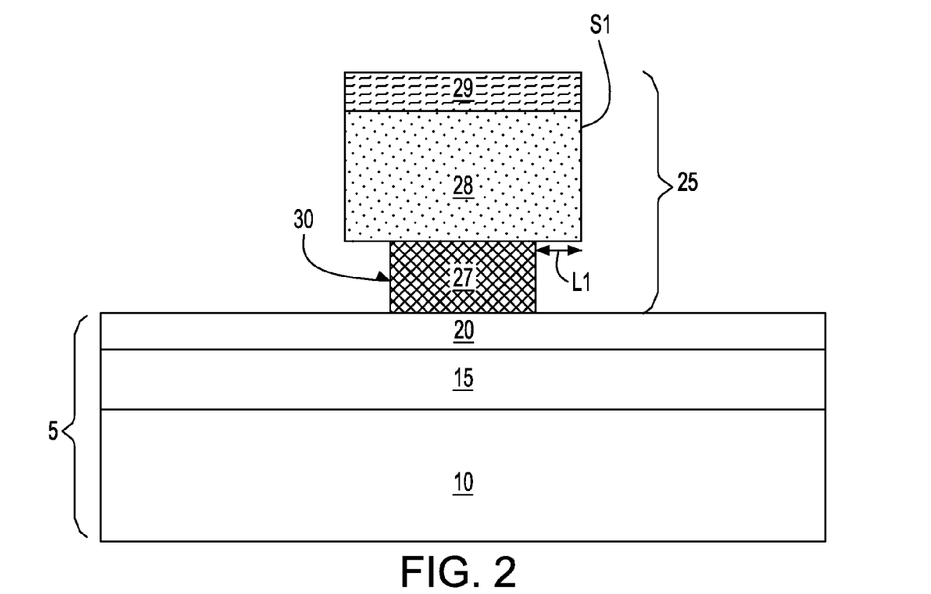
FIG. 2 is a side cross-sectional view depicting forming an undercut region in the sidewall of the dummy gate, in accordance with one embodiment of the present disclosure.

FIG. 2 depicts one embodiment of forming an undercut region 30 in the sidewall of the dummy gate 25. An undercut region 30 is a void that has been formed extending from the original sidewall of the dummy gate 25 towards the center of the dummy gate 25. The undercut region 30 may be formed by an isotropic etch. In comparison to a directional etch, such as an anisotropic etch, the isotropic etch process is a material removal process in which the rate of the etching reaction is substantially similar in any direction. The etch process may include a plasma etch or a wet etch.

In one example, the etch process that forms the undercut region 30 removes the material of the first material layer 27 selective to at least the substrate 5 and the second material layer 28. In one embodiment, in which the first material layer 27 is an oxide, such as silicon oxide, and the second material layer 28 is a semiconductor-containing material, such as polysilicon, the undercut region 30 may be provided by a chemical oxide removal (COR) process. Chemical oxide removal (COR) is a dry etch process. In one example, the chemical oxide removal (COR) process may include exposing the structure to a gaseous mixture of hydrofluoric acid (HF) and ammonia ($NH_4OH$). The ratio of hydrofluoric acid (HF) to ammonia ($NH_4OH$) in the chemical oxide removal (COR) process may range from 2.25:1 to 1.75:1 at a pressure between 0.75 mTorr and 15 mTorr at approximately room temperture (25° C.). In one example, the ratio of hydrofluoric acid (HF) to ammonia ($NH_4OH$) in the chemical oxide removal (COR) is 2:1, at a pressure between 1 mTorr and 10 mTorr and a temperature of about 25° C. During this exposure, the HF and ammonia gases react with the sidewall residue that is present on the exposed surface of the first material layer 27 from the etch process that produced the dummy gate 25 to form a solid reaction product. The solid reaction product is removed in a second step which includes heating the structure to a temperature greater than about 90° C., e.g., 100° C., thus causing the reaction product to evaporate. In another embodiment, the reaction product may be removed by rinsing the structure in water, or removing with an aqueous solution. In another embodiment, the undercut region 30 is formed by an isotropic wet etch composed of hydrofluoric acid (HF), in which the isotropic wet etch removes the material of the first material layer 27 selective to the second material layer 28 and the substrate 5.

In one embodiment, the undercut region 30 extends a dimension L1 ranging from 1 nm to 20 nm, as measured from a sidewall S1 of the second material layer 28. In another embodiment, the undercut region 30 extends a dimension L1 ranging from 2 nm to 15 nm, as measured from a sidewall S1 of the second material layer 28. In an even further embodiment, the undercut region 30 extends a dimension L1 ranging from 5 nm to 10 nm, as measured from a sidewall S1 of the second material layer 28.

Figure 3:
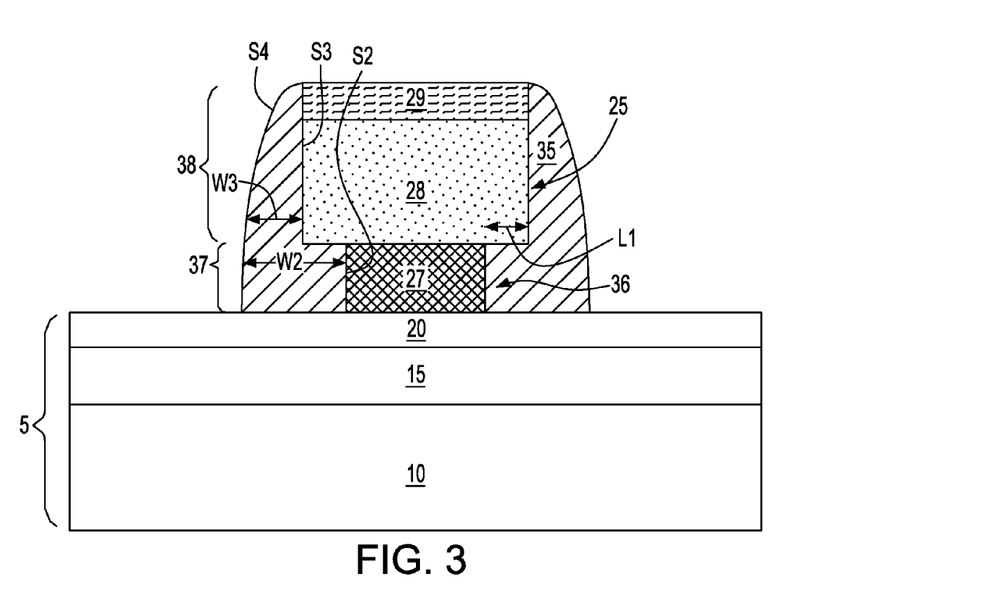
FIG. 3 is a side cross-sectional view depicting forming a spacer adjacent to the sidewalls of the dummy gate, in accordance with one embodiment of the present disclosure.

FIG. 3 depicts one embodiment of forming a spacer 35 adjacent to the sidewalls of the dummy gate 25. The spacer 35 includes an extending portion 36 that fills the undercut region 30 that was formed in the dummy gate 25 by removing a portion of the first material layer 25. The spacer 35 may be composed of any dielectric material that provides that the dummy gate 25 can be removed with an etch that is selective to the spacer 35. In one embodiment, in which the first material layer 27 of the dummy gate 25 is an oxide, such silicon oxide, the spacer 35 may be composed of a nitride, such as silicon nitride. The spacer 35 may be any oxide, nitride or oxynitride material, so long as the spacer 35 is not attacked by the etch process that removes the dummy gate 25. The spacer 35 may be formed by using a blanket layer deposition and an anisotropic etchback method. It is noted that the material for the spacer 35 may be deposited using any deposition method, e.g., chemical vapor deposition, so long as the material for the spacer 35 fills the undercut region 30. The spacer 35 may be a single layer or multiple layers.

In one embodiment, the spacer 35 includes a base region 37 (also referred to as "first spacer portion") which includes an extending portion 36 of the spacer 35 that fills the undercut region 30. The base region 37 includes an interior sidewall S2 that is adjacent to the sidewall of the remaining portion of the first material layer 27. The upper boundary of the base region 37 of the spacer 35 is coplanar with the upper surface of the first material layer 27 of the dummy gate 25. In one embodiment, the width W2 of the upper boundary of the base region 37 of the spacer 35 that includes the extending portion 36 ranges from 5 nm to 50 nm. In another embodiment, the width W2 of the upper boundary of base region 37 of the spacer 35 that includes the extending portion 36 ranges from 10 nm to 40 nm. In yet another embodiment, the width W2 of the base region 37 of the spacer 35 that includes the extending portion 36 ranges from 15 nm to 30 nm.

The spacer 35 also includes an upper region 38 (also referred to as "second spacer portion") that overlying the base region 37 of the spacer 35. The upper region 38 has an interior sidewall S3 that is adjacent to the sidewall of the second material layer 28 of the dummy gate 25. In one embodiment, the width W3 of the lower boundary of the upper region 38 of the spacer 35 ranges from 2 nm to 30 nm. In another embodiment, the width W3 of the lower boundary of the upper region 38 of the spacer 35 ranges from 5 nm to 20 nm. In yet another embodiment, the width W3 of the upper region 38 of the spacer 35 ranges from 5 nm to 15 nm. The width W3 of the upper region 38 of the spacer 35 is less than the width W2 of the base region 37 of the spacer 35.

The interior sidewall S3 of the upper region 38 of the spacer 35 is laterally offset from the interior sidewall S2 of the base region 37 of the spacer 35. The offset between the interior sidewall S2 of the base region 37 of the spacer 35 and the interior sidewall S3 of the upper region 38 of the spacer is equal to the dimension L1 defining the width of the undercut region 30. It is further noted that the interior sidewall S2 of the base region 37 of the spacer 35, and the interior sidewall of the S3 of the upper region 38 of the spacer 35 are substantially parallel to one another, and are substantially perpendicular to the upper surface of the substrate 5. The exterior sidewall S4 of the spacer 35 may have a concave curvature relative to the center of the dummy gate 25, i.e., the apex of the curvature is the point on the curvature having greatest distance from the dummy gate 25.

In one embodiment, the spacer 35 is of a unitary structure. By "unitary structure" it is meant that the base region 37 and the upper region 38 are composed of the same material, and are not separated by an interface seam. An interface seam is a boundary between two separately formed structures.

Figure 4:
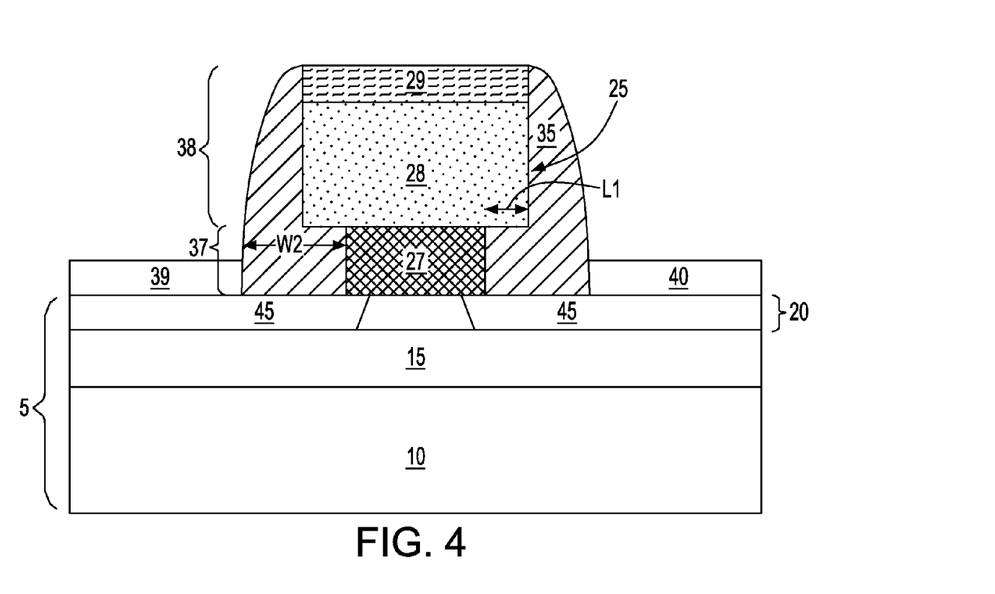
FIG. 4 is a side cross-sectional view depicting forming a raised source region and a raised drain region on the substrate adjacent to the spacer, in accordance with one embodiment of the present disclosure.

FIG. 4 depicts one embodiment of forming a raised source region 39 and a raised drain region 40 on the substrate 5 adjacent to the spacer 35. The width W2 of the base region 37 of the spacer 35 determines the proximity of the raised source region 39 and the raised drain region 40 to the channel of the device. In one embodiment, the raised source region 39 and the raised drain region 40 are composed of in-situ doped semiconductor material that is formed on the ETSOI layer 20 of the substrate 5 using an epitaxial growth process.

"Epitaxial growth and/or deposition" means the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the surface of the ETSOI layer 20 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although higher temperature typically results in faster deposition, the faster deposition may result in crystal defects and film cracking.

In one embodiment, the in-situ doped semiconductor material may be provided by selective-epitaxial growth of SiGe atop the ETSOI layer 20. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxial grown SiGe produces a compressive strain in the portion of the ETSOI layer 20, in which the channel of a semiconductor device, such as a pFET device, is subsequently formed.

The term "in-situ doped" means that the dopant that provides the conductivity of the raised source regions 39 and raised drain regions 40 is introduced during the epitaxial growth process that provides the semiconductor material of the raised source regions 39 and the raised drain regions 40. In one embodiment, the in-situ doped semiconductor material is doped with a first conductivity type dopant during the epitaxial growth process. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

P-type MOSFET devices are produced by doping the in-situ doped semiconductor material for the raised source region 39 and the raised drain region 40 with elements from group III of the Periodic Table of Elements. In one embodiment, the group III element is boron, aluminum, gallium or indium. In one example, in which the in-situ doped semiconductor material for the raised source region 39 and the raised drain region 40 is doped to provide a p-type conductivity, the dopant may be boron present in a concentration ranging from $1 \times 10^{18}$ atoms/cm$^3$ to $2 \times 10^{21}$ atoms/cm$^3$. In one example, the in-situ doped semiconductor material is composed of SiGe and is doped with boron to provide the raised source region 39 and the raised drain region 40 of a p-type conductivity field effect transistor.

In another embodiment, the in-situ doped semiconductor material that provides the raised source region 39 and the raised drain region 40 is composed of epitaxially grown Si:C or carbon doped silicon. The carbon (C) content of the epitaxial grown Si:C ranges from 0.3% to 5%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. In one embodiment, the epitaxial grown Si:C produces a tensile strain in the ETSOI layer 20, in which the channel of a semiconductor device, such as an nFET device, is subsequently formed.

In one embodiment, the in-situ doped semiconductor material is doped with a second conductivity type dopant during the epitaxial growth process. In one embodiment, n-type MOSFET devices are produced by doping the in-situ doped semiconductor material with elements from group V of the Periodic Table of Elements. In one embodiment, the group V element is phosphorus, antimony or arsenic.

Although the raised source region 39 and the raised drain region 40 have been described using an in-situ doping process, the raised source region 39 and the raised drain region 40 may also be formed by depositing an undoped semiconductor layer and then introducing p-type or n-type dopant into the undoped semiconductor layer with ion implantation or gas phase doping.

FIG. 4 further depicts one embodiment of diffusing dopant from the in-situ doped semiconductor material of the raised source region 39 and the raised drain region 40 into the ETSOI layer 20 to form extension regions 45. In one embodiment, the dopant from the in-situ doped semiconductor material is diffused into the ETSOI layer 20 by an annealing processes including, but not limited to, rapid thermal annealing, furnace annealing, flash lamp annealing, laser annealing, or any suitable combination of thereof. In one embodiment, thermal annealing to diffuse the dopant from the in-situ doped semiconductor material into the ETSOI layer 20 is conducted at a temperature ranging from 850° C. to 1350° C.

In one embodiment, in which in-situ doped semiconductor material is doped to a p-type conductivity, the extension regions 45 that are formed in the ETSOI layer 20 have a p-type conductivity. Typically, the dopant concentration of the extension regions 45 having the p-type conductivity ranges from $1 \times 10^{19}$ atoms/cm$^3$ to $2 \times 10^{21}$ atoms/cm$^3$. In another embodiment, the extension regions 45 having the p-type conductivity have a dopant concentration ranging from $2 \times 10^{19}$ atoms/cm$^3$ to $5 \times 10^{20}$ atoms/cm$^3$.

In another embodiment, in which the in-situ doped semiconductor material is doped to an n-type conductivity, the extension regions 45 that are formed in the ETSOI layer 45 have an n-type conductivity. Typically, the dopant concentration of the extension regions 45 having the n-type conductivity ranges from $1 \times 10^{19}$ atoms/cm$^3$ to $2 \times 10^{21}$ atoms/cm$^3$. In another embodiment, the extension regions 45 having the n-type conductivity have a dopant concentration ranging from $2 \times 10^{19}$ atoms/cm$^3$ to $5 \times 10^{20}$ atoms/cm$^3$.

In one embodiment, the extension regions 45 have a depth that extends the entire depth of the ETSOI layer 20. Therefore, the extension regions 45 have a depth of less than 10 nm, typically being 3 nm to 8 nm in depth, as measured from the upper surface of the ETSOI layer 20. Although the extension regions 45 are described above as being formed by diffusing dopant from the raised source region 39 and the raised drain region 40 into the ETSOI layer 20, the extension regions 45 may also be formed by ion implanting of n-type or p-type dopants into the ETSOI layer 20 after forming the dummy gate 25, and before forming the raised source region 39 and the raised drain region 40.

Figure 5:
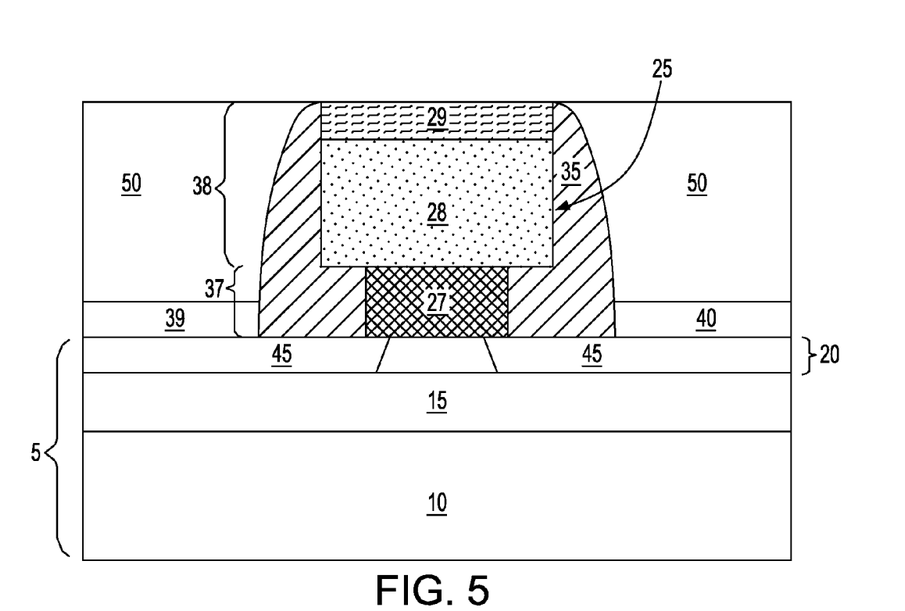
FIG. 5 is a side cross-sectional view depicting an interlevel dielectric layer formed over the raised source region, the raised drain region and the dummy gate region, and planarizing the interlevel dielectric layer to provide an upper surface of the interlevel dielectric layer that is coplanar with an upper surface of the dummy gate, in accordance with one embodiment of the present disclosure.

FIG. 5 depicts one embodiment of forming an interlevel dielectric layer 50 over the raised source region 39, the raised drain region 40 and the dummy gate 25, and planarizing the interlevel dielectric layer 50 to provide an upper surface of the interlevel dielectric layer 50 that is coplanar with an upper surface of the dummy gate 25. The interlevel dielectric layer 50 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the blanket dielectric include, any of the aforementioned materials in porous form, or in a form that changes during processing to or from being porous and/or permeable to being non-porous and/or non-permeable.

The interlevel dielectric layer 50 may be planarized to expose the upper surface of the dummy gate 25. Planarization is a material removal process that employs at least mechanical forces, such as frictional media, to produce a planar surface. The interlevel dielectric layer 50 may be planarized using chemical mechanical planarization (CMP). Chemical mechanical planarization (CMP) is a material removal process using both chemical reactions and mechanical forces to remove material and planarize a surface. In one embodiment, the planarization process stops on the dielectric cap 29 of the dummy gate 25. In another embodiment, the planarization process removes the dielectric cap 29 stopping on the upper surface of the second material layer 28 of the dummy gate 25.

Figure 6:
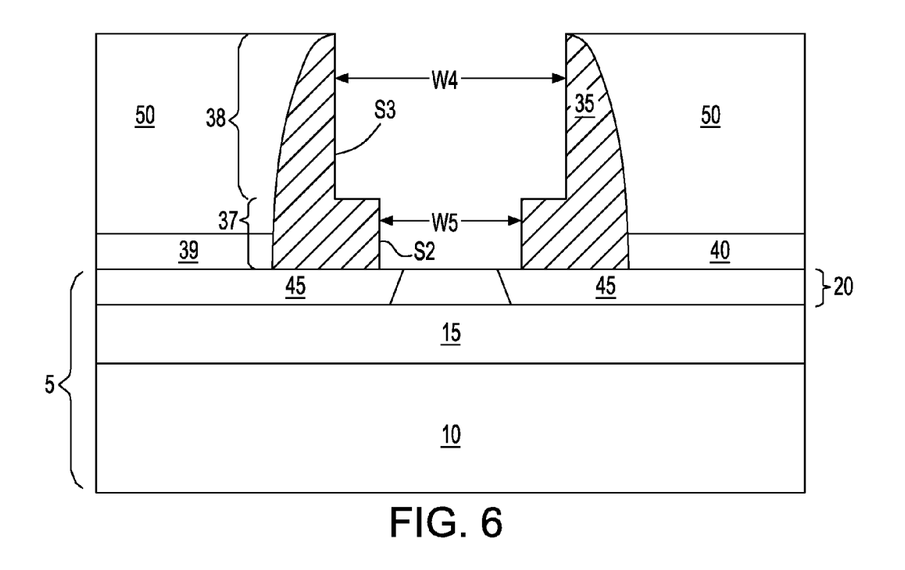
FIG. 6 is a side cross-sectional view depicting removing the dummy gate to provide an opening to the substrate, in accordance with one embodiment of the present disclosure.

FIG. 6 depicts one embodiment of removing the dummy gate 25 to provide an opening to the substrate 5, i.e., an opening to the ETSOI layer 20 of the substrate 5. The dummy gate 25 is typically removed using a selective etch process that removes the dummy gate 25 selective to the substrate 5 and the spacer 35. The etch may be an isotropic etch, such as a wet etch, or an anisotropic etch, such as reactive ion etching. In the embodiments in which the dielectric cap 29 is present atop the dummy gate 25, the dielectric cap 29 may be removed by a selective etch or a planarization process.

In one embodiment, in which the second material layer 28 is composed of polysilicon, the ETSOI layer 20 of the substrate 5 is a silicon-containing material, and the spacer 35 is composed of silicon nitride, the wet etch chemistry for removing the dummy gate 25 may be composed of $NH_4OH$ or tetramethylammonium hydroxide (TMAH). In one embodiment, the etch process that removes the second material layer 28 of the dummy gate 25, also removes the first material layer 27 of the dummy gate 25. In another embodiment, the second material layer 28 is removed by a first etch chemistry that is selective to the first material layer 27, and the first material layer 27 is removed by a second etch chemistry that is selective to the ETSOI layer 20 of the substrate 5.

In one embodiment, the opening that is formed by removing the dummy gate 25 has an upper width W4 that is greater than the lower width W5 of the opening. The upper width W4 is defined by the distance between the interior sidewalls S3 of the upper region 38 of the spacer 35 that are present on opposing sides of the channel. The lower width W5 is defined by the distance between the interior sidewalls S2 of the lower region 37 of the spacer 35 that are present on opposing sides of the channel. In one embodiment, the upper width W4 ranges from 25 nm to 60 nm, and the lower width W5 ranges from 15 nm to 50 nm. The geometry of the opening typically facilitates the process steps to fill the opening with a gate dielectric and a gate conductor.

Figure 7:
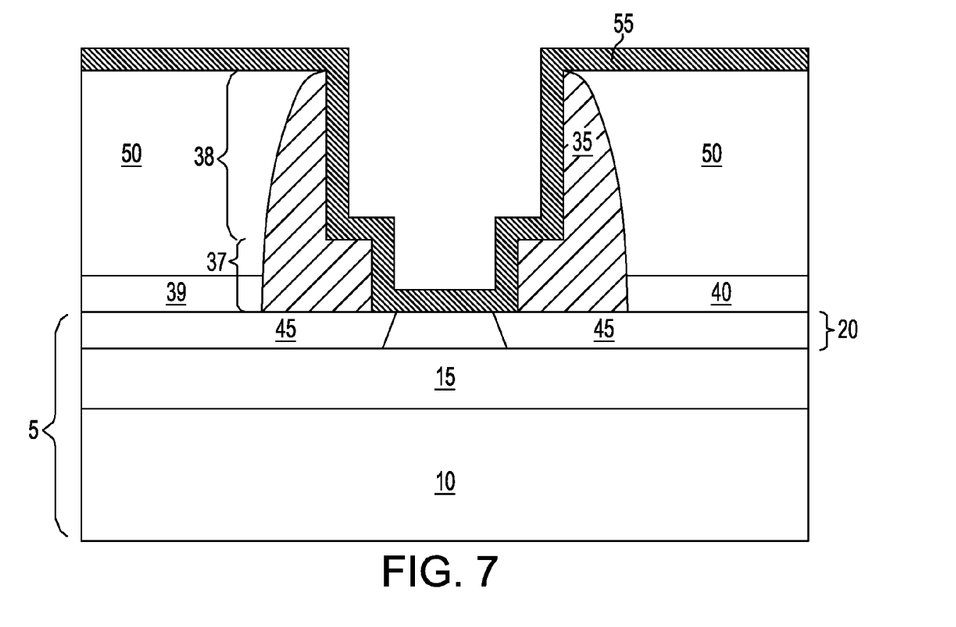
FIG. 7 is a side cross-sectional view depicting forming a conformal gate dielectric on an exposed portion of the substrate within the opening and on the interior sidewalls of the spacer, in accordance with one embodiment of the present disclosure.

FIG. 7 depicts forming a gate dielectric layer 55 on at least the channel portion of the ETSOI layer 20 of the substrate 5. In one embodiment, the gate dielectric layer 55 is formed using a deposition process, such as chemical vapor deposition. Variations of CVD processes for depositing the gate dielectric layer 55 include, but are not limited to, Atmospheric Pressure CVD (APCVD), Low Pressure CVD (LPCVD) and Plasma Enhanced CVD (EPCVD), Metal-Organic CVD (MOCVD) and others. In another embodiment, the gate dielectric layer 55 may be formed by a thermal growth process such as, for example, oxidation, nitridation or oxynitridation.

In one embodiment, the gate dielectric layer 55 is a conformal dielectric layer that is present on the sidewalls S2, S3 of the opening that is formed by removing the dummy gate 25 and the base of the opening, i.e., channel of the substrate 5. The conformal dielectric layer is also present on the sidewalls S2, S3 of the opening in direct contact with upper region 38 of the spacer 35 and the base region 37 of the spacer. The term "conformal" denotes a layer having a thickness that does not deviate from greater than or less than 30% of an average value for the thickness of the layer. The thickness of the gate dielectric layer 55 typically ranges from 1 nm to 10 nm. In one embodiment, the thickness of the gate dielectric layer 55 ranges from 2 nm to 5 nm.

The gate dielectric layer 55 may be composed of any dielectric including, but not limited to $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. The gate dielectric layer 55 may also be a high-k dielectric. The high-k dielectric may be composed of an oxide, a nitride, an oxynitride or combinations and multi-layers thereof. A high-k dielectric may be a material having a dielectric constant that is greater than the dielectric constant of silicon oxide. In one embodiment, the high-k dielectric is comprised of a material having a dielectric constant that is greater than 4.0, e.g., 4.1. In another embodiment, the high-k dielectric is comprised of a material having a dielectric constant greater than 7.0. In yet another embodiment, the high-k dielectric is comprised of a material having a dielectric constant ranging from greater than 4.0 to 30. The dielectric constants mentioned herein are relative to a vacuum.

Some examples of high-k dielectric materials suitable for the gate dielectric layer 55 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the gate dielectric layer 55 has a thickness ranging from 1.0 nm to 10.0 nm. In another example, the gate dielectric layer 55 may have a thickness ranging from 2.5 nm to 5.0 nm. In one embodiment, the gate dielectric layer 55 is hafnium oxide ($HfO_2$). In one embodiment, gate dielectric layer 55 is a multi-layered structure that is composed of a high-k dielectric layer and a metal nitride gate dielectric. In one embodiment, the metal nitride gate dielectric is composed of WN, WSiN, TiN, TiSiN, TaN, TaSiN, TiTaN, TaRuN or combinations thereof.

Figure 8:
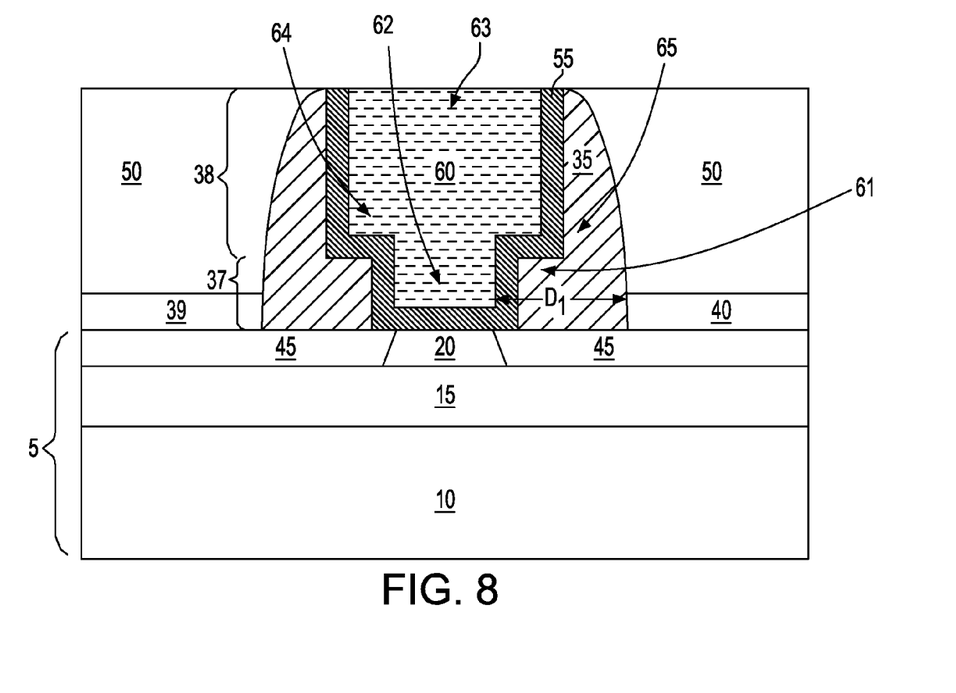
FIG. 8 is a side cross-sectional view depicting depositing a gate conductor on the conformal gate dielectric, in accordance with one embodiment of the present disclosure.

FIG. 8 depicts one embodiment of depositing a gate conductor 60 on the gate dielectric layer 55. The gate conductor 60 may be composed of at least one conductive material including, but not limited to metals, metal alloys, metal nitrides and metal silicides, as well as laminates thereof and composites thereof. In one embodiment, the gate conductor 60 may be composed of any conductive metal including, but not limited to, W, Ni, Ti, Mo, Ta, Cu, Pt, Ag, Au, Ru, Ir, Rh, and Re, and alloys that include at least one of the aforementioned conductive elemental metals. The gate conductor 60 may also comprise doped polysilicon and/or polysilicon-germanium alloy materials (i.e., having a dopant concentration from about $1 \times 10^{18}$ to about $1 \times 10^{22}$ dopant atoms per cubic centimeter) and polycide materials (doped polysilicon/metal silicide stack materials). The gate conductor 60 may be composed of the same material or different materials. The gate conductor 60 may be formed using a deposition method including, but not limited to, salicide methods, atomic layer deposition methods, chemical vapor deposition methods and physical vapor deposition methods, such as, but not limited to, evaporative methods and sputtering methods. Although the gate conductor 60 is depicted in the supplied figures as being a single layer, embodiments have been contemplated in which the gate conductor 60 is a multi-layered structure of conductive materials.

Following deposition of the gate conductor 60, the portion of the gate conductor 60 and the gate dielectric layer 55 that are present on the upper surface of the interlevel dielectric 50 may be removed using planarization, such as chemical mechanical planarization (CMP) or a selective etch. The gate dielectric layer 55 and the gate conductor 60 provide the gate structure 65 to a planar semiconductor device formed on the ETSOI layer 20 of a substrate 5. The term "gate structure" means a structure used to control output current (i.e., flow of carriers in the channel) of a semiconducting device through electrical or magnetic fields.

Referring to FIG. 8, the above process may provide a planar semiconductor device that includes a gate structure 65 present on a substrate 5. In one embodiment, the gate structure 65 includes a gate conductor 60 with an undercut region 61 in sidewalls of a first portion 62 of the gate conductor 60. A second portion 63 of the gate conductor 60 is present over the first portion 62 of the gate conductor 60 and includes a protruding portion 64 over the undercut region 61. The spacers 35 are adjacent to the sidewalls of the gate structure 65. The spacers 35 include an extending portion 36 filling the undercut region 61. A raised source region 39 and a raised drain region 40 is present adjacent to the spacer 35. The raised source region 39 and the raised drain region 40 are separated from the gate conductor 60 by the extending portion 36 of the spacer 35.

The extending portion 36 of the spacer 35 separates the gate conductor 60 of the gate structure 65 from the raised source region 39 and the raised drain region 40 by a distance D1 ranging from 5 nm to 50 nm. In yet another embodiment, extending portion 36 of the spacer 35 separates the gate conductor 60 of the gate structure 65 from the raised source region 39 and the raised drain region 40 by a distance D1 ranging from 10 nm to 30 nm. The extension portion 36 of the spacer 35 reduces the parasitic capacitance between the gate conductor 60 and the raised source region 39 and the raised drain region 50 by approximately 50% when compared to similar structures that do not include a spacer 35 having the extension portion 36, as disclosed herein. In another example, the spacer 35 including the extension portion 36 provides a reduction in parasitic capacitance of 70% or greater.

While the methods and structures disclosed herein have been particularly shown and described with respect to preferred embodiments thereof, it will be understood by those skilled in the art that the foregoing and other changes in forms and details may be made without departing from the spirit and scope of the present disclosure. It is therefore intended that the methods and structures disclosed herein not be limited to the exact forms and details described and illustrated, but fall within the scope of the appended claims.

What is claimed is:

1. A method of forming a semiconductor device comprising:
    forming a dummy gate on a substrate, the dummy gate having sidewalls with an undercut region present therein;
    forming a spacer adjacent to the sidewalls of the dummy gate, wherein the spacer includes a first spacer portion including an extension portion with a first width that fills the undercut region in the sidewall of the dummy gate, and a second spacer portion that is present atop the first spacer portion, the second spacer portion having a second width that is less than the first width;
    forming a raised source region and a raised drain region, wherein the raised source region and the raised drain region are separated from the dummy gate by the extension portion of the spacer;
    removing the dummy gate to provide an opening to the substrate; and
    filling the opening with a gate structure including a gate conductor having an undercut region filled with the extension portion of the spacer.

2. The method of claim 1, wherein the substrate comprises a semiconductor layer having a thickness of less than 10 nm over a dielectric layer.

3. The method of claim 1, wherein the forming of the dummy gate comprises:
    forming a material stack on the substrate, the material stack comprising a first material layer present on the substrate and a second material layer present on the first material layer; and isotropically etching the first material layer selective to the second material layer to provide the undercut region.

4. The method of claim 1, wherein forming the spacer comprises depositing a dielectric layer over the dummy gate, and etching the dielectric layer, wherein a remaining portion of the dielectric layer provides the spacer and is present along an entire sidewall of the dummy gate.

5. The method of claim 1, wherein the forming of the raised source region and the raised drain region comprises epitaxial growth of a semiconductor material on a portion of the substrate adjacent to the spacer, and doping the semiconductor material with a p-type or n-type dopant by ion implantation.

6. The method of claim 1, wherein the forming of the raised source region and the raised drain region comprises epitaxial growth of a semiconductor material on a portion of the substrate adjacent to the spacers, wherein the semiconductor material is in-situ doped with an n-type or p-type dopant.

7. The method of claim 1 further comprising forming extension regions in the substrate using ion implantation prior to the formation of the raised source region and the raised drain region.

8. The method of claim 1 further comprising diffusing n-type or p-type dopants from the raised source region and the raised drain region into the substrate to provide extension regions.

9. The method of claim 1, further comprising forming an interlevel dielectric layer over the raised source region, the raised drain region and the dummy gate, and planarizing the interlevel dielectric layer to provide an upper surface of the interlevel dielectric layer that is coplanar with an upper surface of the dummy gate.

10. The method of claim 9, wherein the removing of the dummy gate comprises removing the dummy gate with an etch process that is selective to the spacer, the interlevel dielectric layer and the substrate.

11. The method of claim 1, wherein the opening has a base width ranging from 15 nm to 50 nm and the opening has an upper width ranging from 25 nm to 60 nm.

12. The method of claim 1, wherein the forming of the gate structure comprises forming a conformal gate dielectric on an exposed portion of the substrate within the opening and interior sidewalls of the opening, and depositing a gate conductor on the conformal gate dielectric.

13. The method of claim 12, wherein the conformal gate dielectric is comprised of a high-k material, and the gate conductor is comprised of a metal.

* * * * *